May 2, 1967 R. C. CHU ETAL 3,317,798

COOLING ELECTRICAL APPARATUS

Filed April 13, 1966 2 Sheets-Sheet 1

INVENTORS
RICHARD C. CHU
PETER J. CUNAVELIS
JULIUS GERSTENHABER
JOHN H. SEELY

BY Robert W. Ely
ATTORNEY

May 2, 1967 R. C. CHU ET AL 3,317,798

COOLING ELECTRICAL APPARATUS

Filed April 13, 1966 2 Sheets-Sheet 2

3,317,798

COOLING ELECTRICAL APPARATUS

Richard C. Chu, Peter J. Cunavelis, Julius Gerstenhaber, and John H. Seely, all of Poughkeepsie, N.Y., assignors to International Business Machines Corporation, Armonk, N.Y., a corporation of New York Filed Apr. 13, 1966, Ser. No. 548,345
7 Claims. (Cl. 317—100)

This invention relates to electric apparatus in which cooling of longitudinally-spaced, heat-generating units is required and more particularly concerns the accomplishing of this cooling by the combination of forced air circulation and localized units of heat removal means.

In the past, it has been customary to use forced-air-convection cooling to remove heat from vertically-spaced computer units, such as printed circuit cards having various components mounted thereon. The cards are mounted in vertical planes in a cabinet so that the air can be forced over the components on the sides of the cards by a vertical air flow direction. For example, a multiplicity of cards are arranged in horizontal rows; and, since the cards of the individual rows are spaced from each other, there will be gaps between the cards. Further, since the cards are usually aligned, there will be continuous vertical passages. Of course, the outer vertical edges of the cards would constitute openings but these are closed by abatement against foam pads on the cabinet door, whereby a plurality of vertical columns or passages are formed when the interiorly-foam-coated door is closed against the outer vertical edges of the cards. Thus, the air entering the bottom of the computer would see a plurality of vertical columns which are formed between adjacent cards in the horizontally-spaced rows of cards.

This arrangement had proved satisfactory when the density of the low-heat-generating components on the cards was relatively small. In other words, in past technology, the amount of heat generated by all of the components on all of the rows of cards could be effectively removed by air flow so that the computer remained within an operating range of plus or minus 10° F.

Subsequent advances in the state of the art have produced relatively-high-heat-generating electrical units, such as integrated circuits. These units or modules have hot, closely-spaced components which individually are reduced in size. The net result is that we have a very small package with many components which generate relatively-large quantities of heat. Further, these new components operate most effectively when the temperature variations are small—that is, if they are provided with an environment which varies only a few degrees of temperature, efficiency and life are improved. In other words—referring again to a physical arrangement similar to that above described—if the newly-developed modules mounted in the lower row have a temperature range of say 75° (plus or minus 2°) this would be satisfactory. However, by the same token, since similar modules would be mounted in the top row, they too would necessarily have to have similar temperature limits. To rephrase this thought as related to present technology, the modules since they are manufactured to uniform standards and for limited environmental conditions must all have the narrow temperature range. Unlike past arrangements, a large temperature range cannot be tolerated. The lower row of modules must sense, for example 95° (plus or minus 5°) and also the uppermost row of modules must also be exposed to 95° F. (plus or minus 5°). In summary, it can be seen that the past cooling methods were not suitable for solving the cooling problems created by the new technology of high-heat-generating electronic units in a computer.

An object of the present invention is to overcome the aforenoted difficulties and to provide cooling means whereby the vertically-arranged rows of electronic modules which can generate large quantities of heat are provided with a small temperature differential environment.

A further object is to provide such a cooling means which is readily adaptable and fits into existing frame-packing arrangements, whereby rearrangement of the modules and reconstruction and design of the doors and supporting means for the new-technology modules is not required.

Another object is the provision of a cabinet having cooling means for high-heat-generating modules which can be easily repaired or replaced, both as to its cooling means and as to the modules.

A further object is to provide cooling means with the above-noted arrangement of electronic modules and cabinet and its door and module support means wherein adequate heat transfer is provided and a narrow temperature band is achieved.

An additional object is to provide such a cooling means wherein there is counter flow of heat removing fluids and a very low temperature differential is maintained between the inlet and the outlet at vertically spaced locations in the computer cabinet.

Another object is to provide a mechanical arrangement whereby access to the electronic modules and access to part of the fluid cooling means is provided.

In accordance with the disclosed embodiment of the invention, there is provided a cabinet which has receptacles for receiving electronic modules by a plug-in type of connection. This cabinet further has a bottom fan arrangement and a top fan arrangement. As above suggested, the electronic modules having a high density of components thereon on one or both sides are arranged in rows with gaps between the modules whereby vertical passages are formed between the adjacent cards. This row pattern is repeated for a multiplicity of rows whereby, when a door is closed against the outer card edges, vertical passage (separated by narrow horizontal gaps) are provided. It is, of course, apparent that, in order to achieve continuous vertical rows except for these horizontal gaps the cards are vertically arranged in the same planes and the various components project out into the vertical passages at different degrees. For this arrangement having a fitting door against the sides of the outer, vertical edges of the module cards, it is apparent that a fan can force air up through the vertical passages with horizontal distribution, even when the cards are not in aligned vertical planes. In order to realize a low temperature differential between the bottom inlet and the top outlet, cooling heat exchangers are mounted on the door and project into the horizontal gaps when the door is closed. Counterflow of the coolant is provided and the flow is serially, although parallel coolant flow is contemplated by this invention as is parallel flow of the air and coolant.

The realization of the above objects, along with features and advantages of the invention, will be apparent from the following description of an embodiment of the invention and the accompanying drawing in which.

Figure 1:
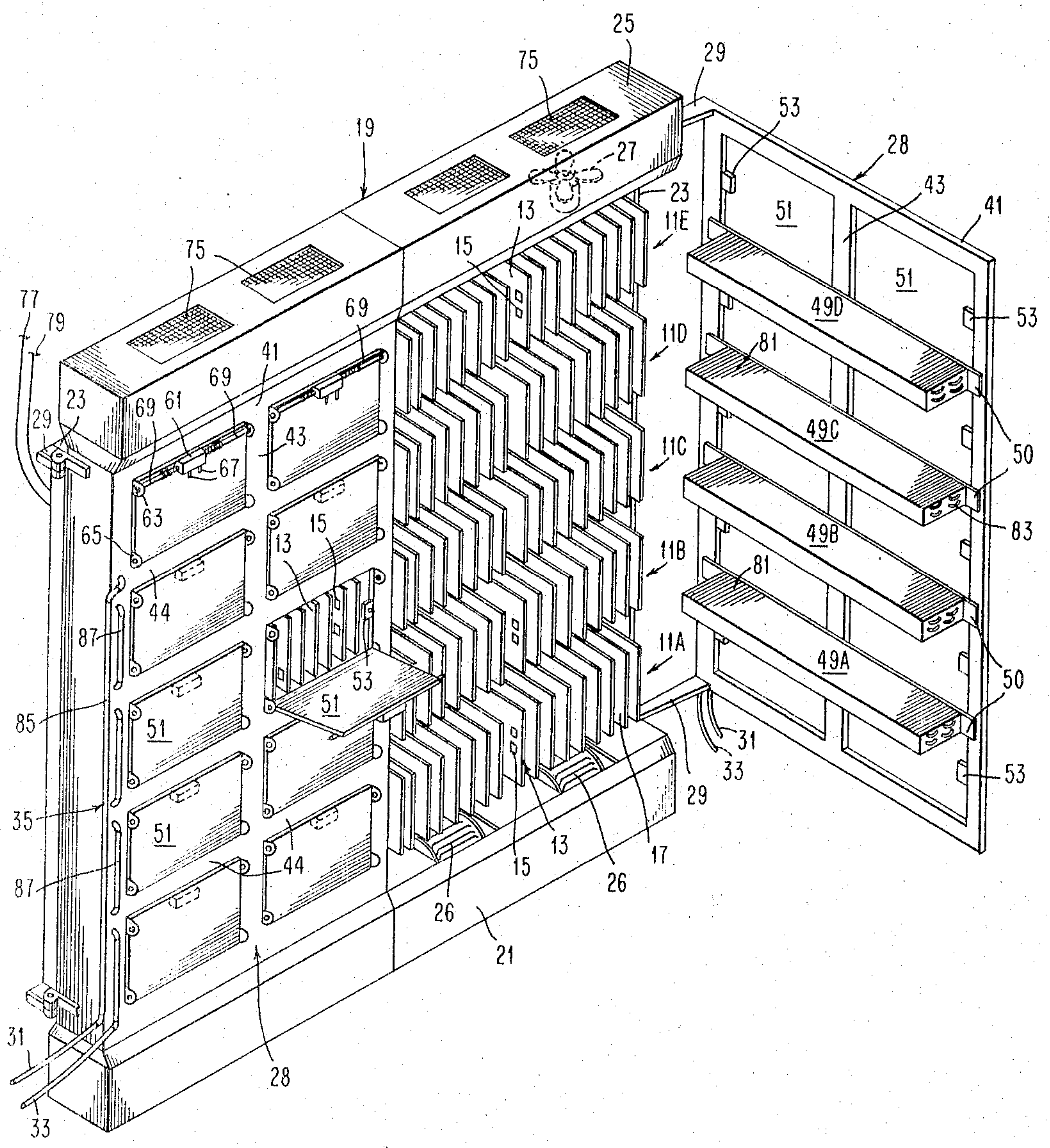
FIG. 1 is a perspective showing of the front of a cabinet unit data processing system and shows an opened door having heat removal exchangers adapted to fit between horizontal rows of electronic modules.

In FIG. 1, horizontal rows 11A–11E of modules 13 are arranged one above the other. Each module 13 is comprised of various electrical components or integrated circuits 15 and a printed circuit card 17. Each card 17 is plugged into a socket which will be described. A cabinet 19 supports the sockets and input-output cables (not shown) and is comprised of a base 21, a side member 23, and a top 25. Fans 26 and 27 are respectively positioned in base 21 and top 25. A door 28 closes the opening in the cabinet 19 and has two brackets 29 hinged to cabinet side members 23. Door 28 has foam rubber (not shown) for abutting the card edges to confine vertical air flow to within the profiles of the modules.

Considering now the details of the large door 28, we can see that there is an outer rectangular frame part 41 and a central-vertically-extending frame part 43 interconnecting the top and bottom members of the large frame member 41. There are also horizontally-extending members 44 extending between the vertical side members of the large door frame 41 and the central vertically-extending member 43. It will be noted that these horizontally extending frame members 44 do not appear in the open door at the right of FIG. 1 because the liquid heat exchangers 49A–D are mounted thereon by means of brackets 50. Each large door has ten sub-doors or access covers 51. The backs of these access covers 51, of course, appear in the open door to the right of FIG. 1. In that view, as we see it, there are small box-like switches 53 mounted in the side members of the large frame 41. These microswitches 53 are normally opened by the access covers being closed. When one access cover or a plurality of access covers is opened, these microswitches will be triggered to close in an electrical top fan circuit, as will be described. Such an access cover is shown in open position in the large door at the left in FIG. 1. In that showing, the operating bottom of microswitch 53 can be seen. It is further to be noted that each of the access covers 51 have manual operating means 67 for the latch means 61 for disconnecting the latch from the brackets 63 so that the cover can swing downwardly on hinges 65. Reference to either one of the top covers in the closed door to the left in FIG. 1 will show this arrangement. The latching means 61 includes two little handles 67 which are urged together and thus pull latching rods 69 towards the center of the access cover and out of the side catches 63. It is to be noted that the cabinet has four top vents 75 under which are provided pull fans 27 (one being shown by dashed lines). Electricity flowing into the microswitches 53 enters the cabinet by means of two wires 77 and 79, shown on the top left corner of the cabinet. It is to be noted that the open right hand door of FIG. 1 has a flexible inlet hose 31 and a flexible output hose 33 which have flexed upon opening and, at the left, the hoses 31 and 33 which have reflexed upon closing.

From the foregoing description, it is apparent that air is drawn into the cabinet at the bottom rear thereof by fans 26 and is pushed upwardly through the cabinet. It is to noted that the discharge of either of the bottom fans will be distributed by the arrangement of the cards in the row adjacent to the fans and that the horizontal distribution will be improved as it progresses upwardly. The inlet air after being discharged by the fans will cool the bottom row 11A of the computer and then will pass upwardly through the vertical fins 81 of the heat exchangers 49A–D. Heat exchangers 49A–D have four loops 83 of coolant tubing extending horizontally in the fins 81 and are suitably connected to pipings 35 which include an inlet pipe 85 and shorter interconnecting return pipes 87, as appears on the closed left-hand door. Water or other suitable cooling fluid including gases enters through hose 31, moves up through pipe 85 to the top heat exchanger 49D and then passes through the loops 83 removing heat from the air, as well as heat from the fins 81. Next the coolant moves downwardly to the next heat exchanger through pipe 87 and so forth.

Figure 2:
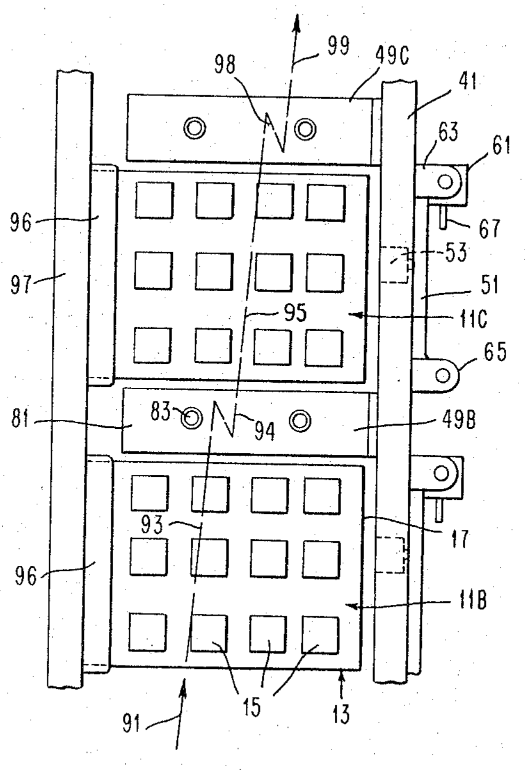
FIG. 2 is a partial showing of the FIG. 1 construction and shows two modules having components such as integrated circuits and a finned-coil, heat exchanger therebetween.

Referring now to FIG. 2 of the drawing, it can be appreciated how the counterflow cooling is achieved. Thus, the air enters at the bottom of the partial showing of the cabinet, as indicated by the lower arrow 91, moves upwardly over module row 11B, as indicated by the dashed-line 93; and then is cooled by heat exchanger 49B, as indicated by the jog 94 of the dashed-line. Next it proceeds to cool the upper row 11C mounted in sockets 96 in back wall structure 97, as indicated by the rightwardly-inclined dashed-line 95, is cooled by heat exchanger 49C, as indicated by the jog 98; and then proceeds, as indicated by the arrow 99, to eventual discharge through vents 75. It is apparent that the schematic representation shows that the air enters at the bottom, is heated slightly by removing heat from the card 13 and electronic components 15 of row 11B as it moves through row 11B. Next, the air is cooled by heat exchanger 49B having the coils 83 and fins 81. The air then proceeds upwardly and performs another cooling function and then it cools itself in the upper heat exchanger 49C. This, of course, gives the mode of operation (by dash lines and arrows aforenoted) where the low temperature gradient is sensed by the entire arrangement and the individual components or cards have a small temperature differential or a narrow band of environmental temperature. Even closer temperature limits are obtained by a common inlet feeding the refrigerant to each heat exchanger.

Figure 3:
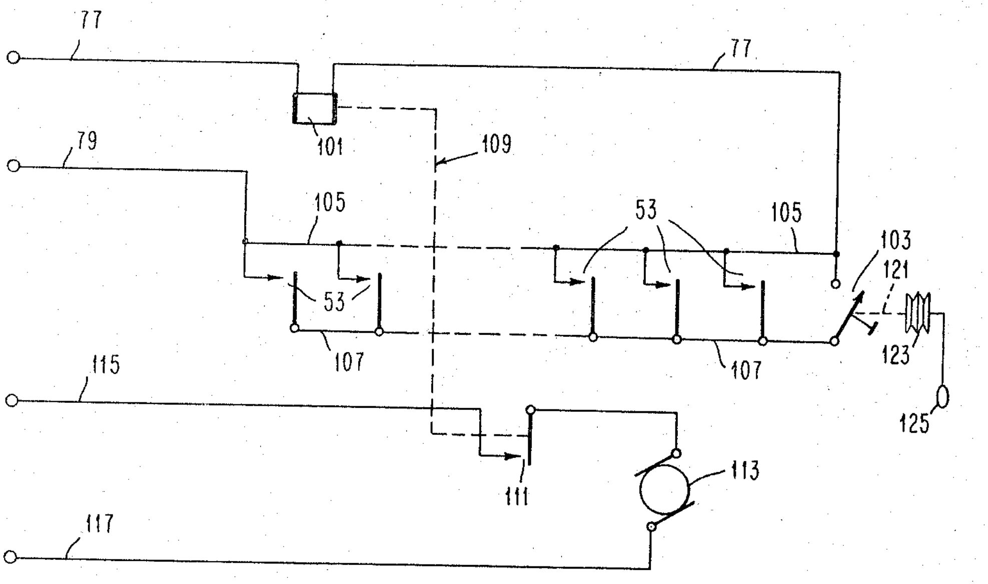
FIG. 3 is a schematic of the electrical control circuit and shows how opening of small access covers or an environmental condition can energize an auxiliary fan.

Referring now to FIG. 3 of the drawing, it can be appreciated that the current or electricity is provided to circuits in the cabinet by wires 77 and 79 (previously mentioned). Wire 77 leads to the relay coil 101 and continues to a manual switch 103. A branch wire 105 extends from wire 77, before switch 103. The switch 103 is connected to a wire 107. Between these parallel wires 105 and 107 a plurality of microswitches 53, above mentioned, are shown and are mounted on the frame. These switches 53 are operated by the access covers 51. Wire 107 terminates at left-side microswitch 53. Wire 105 terminates at the same microswitch and then connects to wire 79. It is to be noted that, when manual switch 103 is closed, relay 101 will be energized and thus the mechanical connection indicated by dashed line 109 will operate relay switch 111 which turns on the upper fan motors 113. The upper fan motors 113 are provided with electricity by means of wires 115 and 117 which are not shown in FIG. 1 of the drawing. From the foregoing description, it is apparent that, when any one of the access covers is opened, the top fan 27 will be turned on and thus draw or pull in air through the opening of the access cover and prevent the escape of cooled air so that proper flow and hence temperatures are maintained. The manual switch 103 has an environmental high temperature override provided by mechanical linkage 121, a bellows 123 and a fluid temperature sensor 125 connected to the bellows. With this arrangement, the environmental temperature is sensed at the air inlet to the bottom fan 26 or a nearby location is able to turn on the top fan 27 to augment the coolant heat removal when the room temperature exceeds a predetermined limit.

While the invention has been particularly shown and described with reference to a preferred embodiment thereof, it will be understood by those skilled in the art that various changes in form and details may be made therein without departing from the spirit and scope of the invention.

What is claimed is:

1. An electric apparatus in which cooling of longitudinally-spaced heat-generating units is required, comprised of:

a cabinet having a vertically-rotatable door and rows of heat-generating units longitudinally-spaced to provide transverse spaces between adjacent rows of units, heat exchangers mounted on and extending from said door and arranged to be positioned in said transverse spaces between said rows of units when said door is closed, said door being rotated to closed position, conduit means for a flow of a coolant connected to said heat exchangers and having flexible inlet and outlet conduits for accommodating the opening and closing of said door, and air moving means arranged to move air over said units and said heat exchangers in which the coolant would flow whereby heat is removed by said heat exchangers in said transverse spaces from the air to give a small temperature gradient.

2. An electric apparatus in which cooling of longitudinally-spaced heat-generating units is required, comprised of:

a cabinet having a vertically-rotatable door and heat-generating units longitudinally-spaced to provide transverse spaces between adjacent units, heat exchangers extending from said door and arranged to be positioned in said transverse spaces when said door is closed, said door being rotated to closed position, conduit means for a coolant connected in a predetermined direction to said heat exchangers to give a coolant flow and having flexible inlet and outlet conduits for accommodating the opening and closing of said door, and air moving means arranged to move air over said units and said heat exchangers in a direction opposite to the flow of the coolant whereby heat is serially removed from the air to give a small temperature gradient.

3. The electric apparatus according to claim 2 and being further characterized by:

said air moving means including a push fan and pull fan with one of said fans normally being energized, said door having a plurality of access covers, and control means arranged on said door and connected to energize the other of said fans when any one of said covers is moved to open position whereby cooled air does not escape and effective cooling continues.

4. The electric apparatus according to claim 3 and being further characterized by:

control means connected to the other of said fans and arranged to energize the other of said fans when the environmental temperature exceeds a predetermined limit.

5. The electric apparatus according to claim 2 and being further characterized by:

said air moving means including a push fan and pull fan with one of said fans being normally energized, said door having a plurality of access cover which are moveable to open position, control means arranged to energize the other of said fans when any one of said covers is moved to open position whereby cooled air does not escape and effective cooling continues, and said control means being further arranged to energize the other of said fans when the environmental temperature exceeds a predetermined limit.

6. An electric apparatus in which cooling of longitudinally-spaced heat-generating units is required, comprised of:

a cabinet having vertically-rotatable door and heat-generating units longitudinally-spaced to provide transverse spaces between adjacent units, heat exchangers on said door extending into said transverse spaces and being removable therefrom when the door is opened so that access is provided to said cabinet at the location of at least one of said heat exchangers, conduit means for a coolant connected in a predetermined direction to said heat exchangers to give a certain coolant flow and having flexible inlet and outlet conduits, and air forcing means arranged to move air over said units and said heat exchangers in a direction opposite to the flow of the coolant whereby heat is serially removed from the air to give a small temperature gradient.

7. The electric apparatus according to claim 6 and being further characterized by:

said air forcing means including a push fan and pull fan with the pull fan normally being energized, said cabinet having a plurality of hinged access covers which can be moved to open position for said units, and control means arranged to energize the push fan of said fans when any one of said covers is moved to open position whereby cooled air does not tend to escape and effective cooling continues when servicing is being done through an opened cover.

References Cited by the Examiner

UNITED STATES PATENTS

| | | | |
|---|---|---|---|
| 2,187,011 | 1/1940 | Braden | 317—100 X |
| 3,198,991 | 8/1965 | Barnett | 317—100 |
| 3,224,221 | 12/1965 | Raskhodoff | 174—16 X |

ROBERT K. SCHAEFER, *Primary Examiner.*

M. GINSBURG, *Assistant Examiner.*